United States Patent
Lin et al.

(10) Patent No.: US 7,354,824 B2
(45) Date of Patent: Apr. 8, 2008

(54) FABRICATION METHOD OF NON-VOLATILE MEMORY

(75) Inventors: Hsin-Fu Lin, Hsinchu (TW); Chun-Pei Wu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 136 days.

(21) Appl. No.: 11/417,791

(22) Filed: May 3, 2006

(65) Prior Publication Data

US 2007/0259496 A1    Nov. 8, 2007

(51) Int. Cl.
*H01L 21/336* (2006.01)

(52) U.S. Cl. .............. 438/257; 438/253; 438/258; 438/260; 438/262; 438/264; 438/265; 257/E21.682

(58) Field of Classification Search ............ None
See application file for complete search history.

(56) References Cited

U.S. PATENT DOCUMENTS 6,979,620 B1   12/2005   Wu et al. ............. 438/258

2002/0187609 A1*  12/2002   Kim et al. ............. 438/257

* cited by examiner

*Primary Examiner*—Michael Lebentritt
*Assistant Examiner*—Kyoung Lee
(74) *Attorney, Agent, or Firm*—J.C. Patents

(57) ABSTRACT

A method for fabricating a non-volatile memory is provided. A dielectric layer, a first conductive layer, and a mask layer are formed sequentially on a substrate and then patterned to form a number of openings and floating gates. In addition, spacers are formed on the sidewalls of the openings. A source/drain region is formed in the substrate underneath each of the openings. A thermal process is performed to oxidize the substrate exposed by the opening to form an insulating layer above the source/drain region. Afterward, the mask layer is removed and an inter-gate dielectric layer is formed to cover the surface of the first conductive layer and the surface of the insulating layer. Subsequently, a second conductive layer is formed on the inter-gate dielectric layer.

12 Claims, 2 Drawing Sheets

FABRICATION METHOD OF NON-VOLATILE MEMORY

BACKGROUND OF THE INVENTION

1. Field of Invention

The present invention relates to a method of fabricating a semiconductor device. More particularly, the present invention relates to a method for fabricating a non-volatile memory.

2. Description of Related Art

The non-volatile memory allows multiple and repetitive writing, reading and erasure operations, and the storage data are retained even after the power supply is discontinued. Except for the aforementioned advantages, the non-volatile memory also has other advantages, including rapid writing/erasure rate, large storage capacity and compactness, and has been widely applied in the electronic products and personal computers.

In general, the non-volatile memory cell is comprised of a stacked gate, made or doped polysilicon and consisting of a floating gate and a control gate. A dielectric layer is disposed between the floating gate and the control gate, while a tunnel oxide layer is located between the floating gate and the substrate. The floating gate is disposed between the substrate and the control and in a "floated" state (i.e. not being electrically connected with any circuit). The control gate is electrically connected with the word line.

For the memory device, if the gate couple ratio (GCR) between the floating gate and the control gate is larger, the required operation voltage can be lower and the efficiency of the device can be increased. In order to increase the gate couple ratio, either the capacitance of the inter-gate dielectric layer is increased or the capacitance of the tunnel oxide layer is decreased. For increasing the capacitance of the inter-gate dielectric layer, it is necessary to increase the overlapped area between the control gate and the floating gate.

FIG. 1 is a cross-sectional view of a prior non-volatile memory structure. The memory structure includes a substrate 100, a tunnel oxide layer 102 floating gates 104, a inter-gate dielectric layer 106, a conductive layer 108, source/drain regions 110 and a oxide layer 112. The floating gate 104 consists or two different conductive layers 104a and 104b. After patterning the conductive layer 104a of the floating gates 104, in order to increase the GCR, another conductive layer 104b is defined and patterned by photolithography and etching. Due to many uncontrollable factors of photolithography, misalignment often occurs to the floating gates during the photolithography process. Especially if misalignment happens during the photolithography and etching process of the conductive layer 104b, bridging between the separate floating gates may occur and the following deposition of the inter-gate dielectric layer 106 becomes uneven, leading to varying GCR of the floating gates.

SUMMARY OF THE INVENTION

The invention provides a method for fabricating a non-volatile memory by forming the buried drain oxide layer in a self-aligned way, thus simplifying the fabrication processes and increasing the process window. The method of the present invention can also increase the gate couple ratio between the floating gate and the control gate and improve the performance of the devices. Moreover, in the method of this invention, at least one photolithography process is omitted and varying gate couple ration due to bridging between floating gates call be alleviated.

As embodied and broadly described herein, the present invention provides a fabrication method of a non-volatile memory. The fabrication method includes the following steps. A dielectric layer, a first conductive layer and a mask layer are formed over a substrate and are partially removed to form a plurality of openings; forming a plurality of spacers on sidewalls of the openings. A plurality of source/drain regions is formed in the substrate under the openings. After performing a thermal oxidation process to oxidize the substrate exposed by the openings to form an insulating layer above the source/drain region the mask layer is removed. An inter-gate dielectric layer is formed over the substrate, covering a surface of the first conductive layer and a surface of the insulating layer and then a second conductive layer is formed on the inter-gate dielectric layer.

According to the embodiment, the spacers can be removed along with the mask layer or after the removal of the mask layer. The spacers can be made of silicon nitride, with a thickness of about 50-400 angstroms, preferably about 100-200 angstroms. The inter-gate dielectric layer can be a silicon oxide/silicon nitride/silicon oxide (ONO) composite layer with a thickness of about 100-250 angstroms.

In the present invention, because the insulating layers are formed in a self-aligned way between the floating gates, at least one photolithography process is omitted. Hence, fabrication processes are simplified and the process window and the reliability are increased by self-alignment. Further, with less bridging phenomenon, the inter-gate dielectric layer covering the floating gates can be formed evenly, and the GCR of the non-volatile memory accordingly becomes more stable.

For the non-volatile memory structure of this invention, because of the buried drain oxide layer, the overlapped area between the floating gate and the control gate becomes larger and the gate couple ratio between the floating gate and the control gate is increased, thus enhancing the performance of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A-2E are cross-sectional views illustrating the process steps for forming a non-volatile memory structure according to one preferred embodiment of the present invention.

Figure 1:
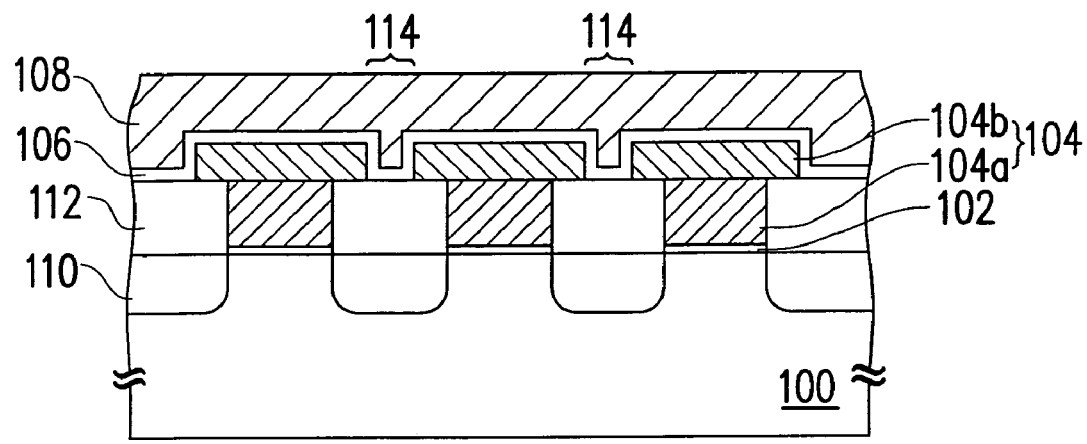
FIG. 1 is a cross-sectional view of a prior non-volatile memory structure.
Figure 2A:
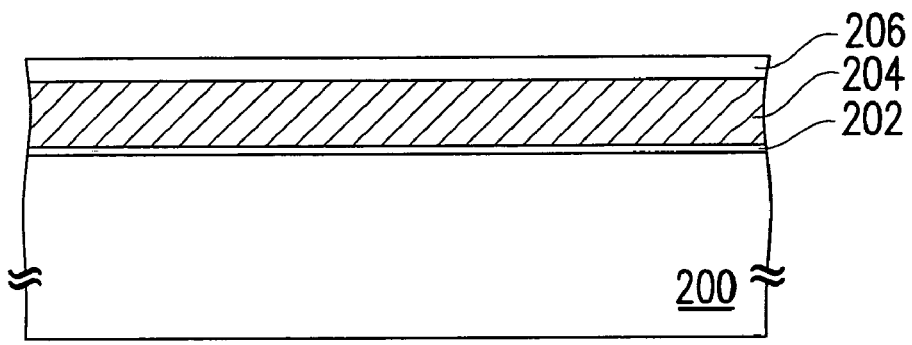
FIGS. 2A-2E are cross-sectional views illustrating the process steps for forming a non-volatile memory structure according to one preferred embodiment of the present invention.

Referring to FIG. 2A, a substrate 200, for example, a silicon substrate is provided. A dielectric layer 202 is formed on the substrate 200. The material of the dielectric layer 202 can be silicon oxide formed by thermal oxidation, for example. A conductive layer 204 is formed on the dielectric layer 202. The conductive layer 204, for example, is a doped polysilicon layer formed by either depositing an un-doped polysilicon layer by chemical vapor deposition (CVD) and then implanting dopants or deposition by CVD with in-situ doping. Later, a dielectric layer 206 is formed over the substrate 200 and on the conductive layer 204. The material of the dielectric layer 206 is silicon nitride formed by CVD, for example.

Figure 2B:
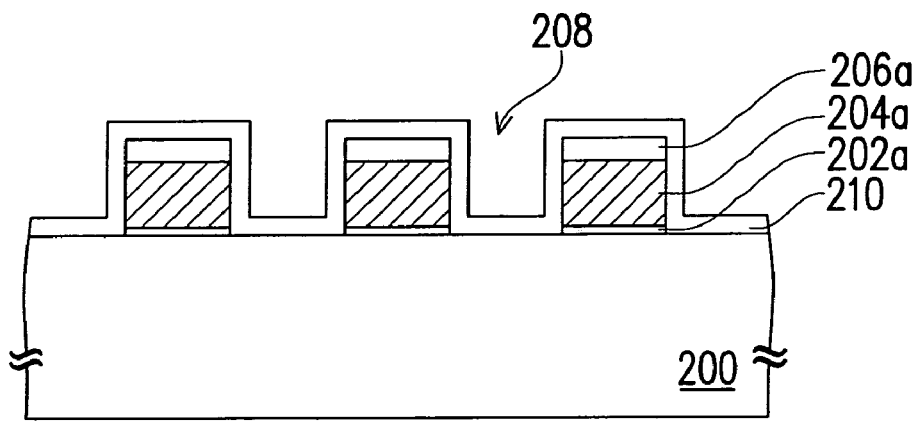

Referring to FIG. 2B, the dielectric layer 206 is patterned to form a patterned dielectric (mask) layer 206a. The mask layer 206a can be formed by, for example, forming a patterned photoresist layer (not shown) on the dielectric layer 206, performing an anisotropic etching process to partially remove the dielectric layer 206 and then remove the remained photoresist layer. Using the mask layer 206a as an etch mask, the conductive layer 204 and the dielectric layer 202 are patterned to form floating gates 204a, tunnel oxide layer 202a and openings 208. For example, the conductive layer 204 and the dielectric layer 202 are patterned by performing an anisotropic etching process using the dielectric layer 202 as the etching stop layer. In this embodiment, the openings 208 expose a portion of the substrate 200. However, the present invention is not limited to this, and a portion of the dielectric layer 202 may be retained in the bottom of the openings 208, according to another embodiment.

Referring again to FIG. 2B, a conformal dielectric layer 210 is formed covering the exposed surface of the openings 208 and the surface of the mask layer 206a. The material of the dielectric layer 210 is silicon nitride formed by CVD, for example.

Figure 2C:
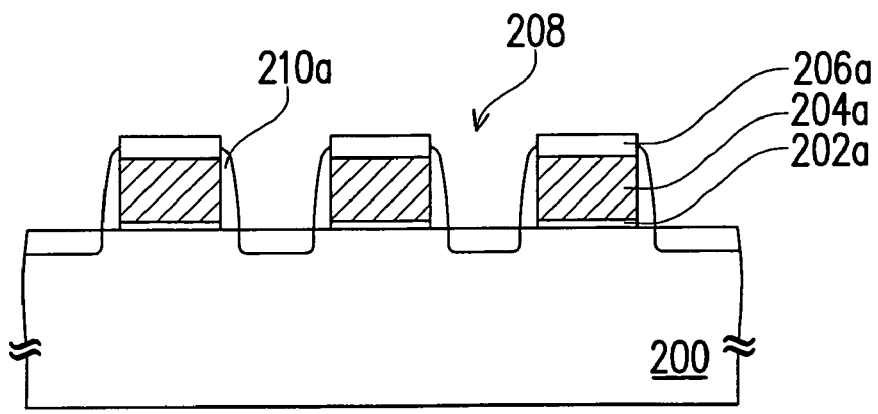

Next, referring to FIG. 2C, a plurality of spacers 210a are formed on sidewalls of the openings 208. The method for forming the spacers 210, for example, includes etching back the dielectric layer 210 by performing an anisotropic etching process until the first dielectric layer within the opening 208 is exposed and/or the surface of the mask layer 206a is exposed. The thickness of the spacers 210a is, for example, about 50-400 angstroms, preferably about 100-200 angstroms. Later, source/drain regions 212 are formed in the substrate 200 under the openings 208 by, for example, ion implantation.

Figure 2D:
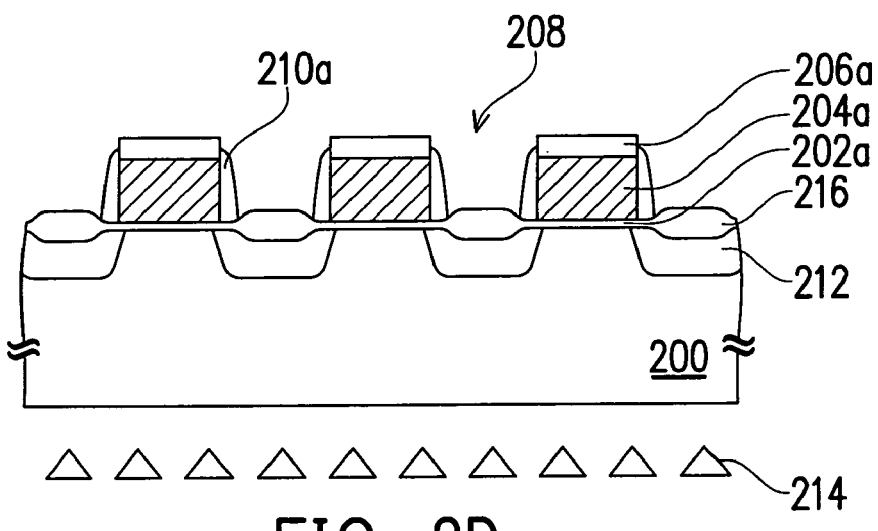

Referring to FIG. 2D, a thermal oxidation process 214 is performed to oxidize the substrate surface exposed by the openings 208, to form an insulating layer 216 above the source/drain regions 212. The thermal oxidation process 214 employs, for example, the local oxidation of silicon (LOCOS) technology with a reaction temperature of about 700-1100° C. The insulating layer 216 is, for example, a silicon oxide layer with a thickness of about 200-600 angstroms, preferably about 300-400 angstroms. The surface of the insulating layer 216 formed by LOCOS technology is slightly higher than the surface of the substrate 200, and the bird's beak structure may further reinforce the insulation. Since the insulating layer 216, functioning as the buried drain oxide layer, is formed by the thermal oxidation process, it has better insulating ability than the oxide layer formed by CVD.

Further, by using the thermal oxidation process, the insulating layer 216 is formed in a self-aligned way between the floating gates and above the source/drain regions. Therefore, the photolithography process is saved and the overlay errors can be avoided. During the thermal oxidation process 214, the sidewalls of the floating gates 204a are protected by the spacers 210a. Due to the thermal oxidation process 214, dopants in the source/drain regions 212 will diffuse out and the profile of the source/drain regions 212 will become larger.

Figure 2E:
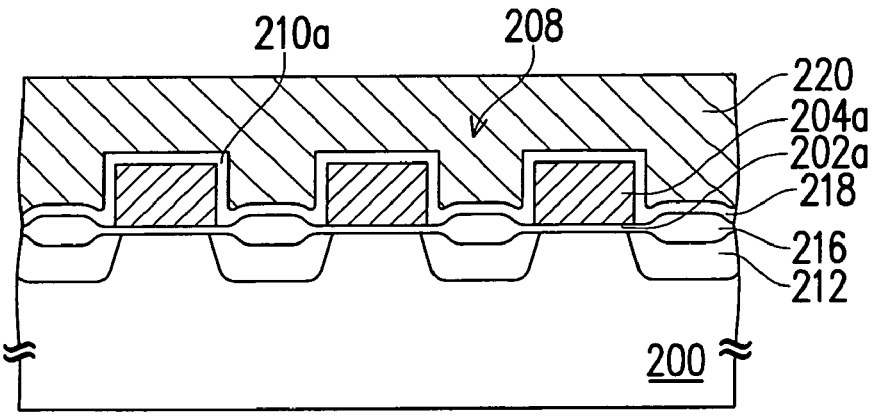

Referring to FIG. 2E, the mask layer 206a is removed by, for example, wet etching using hot phosphoric acid. In this embodiment, the mask layer 206a and the spacers 210a are removed simultaneously. Alternatively, the spacers 210a are removed by another wet etching process after removing the mask layer 206a. Later, an inter-gate dielectric layer 218 is formed over the substrate 200, covering the surface of the floating gates 204a and the surface of the insulating layer 216. The material of the inter-gate dielectric layer 218 can be silicon oxide/silicon nitride/silicon oxide (ONO), for example. The thickness or the inter-gate dielectric layer 218 is about 100-250 angstroms, preferably, about 150 angstroms.

Then, a conductive layer 220 is formed on the inter-gate dielectric layer 218 and over the substrate 200. The conductive layer 220 functions as the control gate of the non-volatile memory. The conductive layer 220 can be a composite layer of a doped polysilicon layer and a metal silicide layer, for example. The method for forming the conductive layer 220 is well-known to any one of this field and will not be described in details herein.

Since the surface of the insulating layer 216 is lower than the top surface of the floating gates 204a, the overlapped area between the conductive layer 220 (control gate) and the floating gate 204a is increased due to the height difference, thus increasing the gate couple ratio (GCR).

In summary, the method of this invention has at least the following advantages:

Since the buried drain oxide layers are formed in a self-aligned way, at least one photolithography process is omitted when compared with the prior art and fabrication processes are simplified. Accordingly, the process window is increased and reliability is improved due to self-alignment.

Because the surface of the buried drain oxide layer is lower than the surface of the floating gate, the overlapped area between the control gate and the floating gate is increased and the GCR becomes larger.

The GCR of the non-volatile memory becomes more constant due to only one photolithography process is required for the floating gate and the related bridging phenomenon can be alleviated. Therefore, the operation speed and performance of the device are enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a non-volatile memory structure, comprising:

forming a first dielectric layer, a first conductive layer and a mask layer over a substrate;

removing a portion of the first dielectric layer, the first conductive layer and the mask layer to form a plurality of openings;

forming a plurality of spacers on sidewalls of the openings;

forming a plurality of source/drain regions in the substrate under the openings;

performing a thermal oxidation process to oxidize the substrate exposed by the openings to form an insulating layer above the source/drain region;

removing the mask layer;

forming an inter-gate dielectric layer over the substrate, covering a surface of the first conductive layer and a surface of the insulating layer; and forming a second conductive layer on the inter-gate dielectric layer.

2. The method of claim 1, further comprising removing the spacers after removing the mask layer or during removing the mask layer.

3. The method of claim 2, wherein the step of forming a plurality of spacers on sidewalls of the openings comprises:

forming a second dielectric layer over the substrate, covering the mask layer and surfaces of the openings; and performing an anisotropic etching process to remove a portion of the second dielectric layer until first dielectric layer of the opening is exposed.

4. The method of claim 1, wherein a material of the spacer includes silicon nitride.

5. The method of claim 1, wherein a thickness of the spacer is about 50-400 angstroms.

6. The method of claim 1, wherein a thickness of the spacer is about 100-200 angstroms.

7. The method of claim 1, wherein a temperature of the thermal oxidation process is about 700-1100° C.

8. The method of claim 1, wherein a material of the insulating layer includes silicon oxide.

9. The method of claim 1, wherein a thickness of the insulating layer is about 200-600 angstroms.

10. The method of claim 1, wherein a thickness of the insulating layer is about 300-400 angstroms.

11. The method of claim 1, wherein a material of the inter-gate dielectric layer includes silicon oxide/silicon nitride/silicon oxide.

12. The method of claim 1, wherein a thickness of the inter-gate dielectric layer is about 100-250 angstroms.

* * * * *